(12) United States Patent
Takahashi

(10) Patent No.: US 7,943,021 B2
(45) Date of Patent: May 17, 2011

(54) SB-TE ALLOY SINTERED COMPACT TARGET AND MANUFACTURING METHOD THEREOF

(75) Inventor: Hideyuki Takahashi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 974 days.

(21) Appl. No.: 11/722,218

(22) PCT Filed: Nov. 29, 2005

(86) PCT No.: PCT/JP2005/021871
§ 371 (c)(1),
(2), (4) Date: Jun. 20, 2007

(87) PCT Pub. No.: WO2006/067937
PCT Pub. Date: Jun. 29, 2006

(65) Prior Publication Data
US 2010/0025236 A1    Feb. 4, 2010

(30) Foreign Application Priority Data
Dec. 24, 2004  (JP) ................. 2004-373058

(51) Int. Cl.
*C23C 14/34* (2006.01)
(52) U.S. Cl. ............... 204/298.13; 204/298.12; 419/23; 75/228
(58) Field of Classification Search ............ 204/192.12, 204/192.13; 419/23; 75/228
See application file for complete search history.

(56) References Cited

U.S. PATENT DOCUMENTS

| | | |
|---|---|---|
| 7,156,964 B2 | 1/2007 | Yahagi et al. |
| 7,484,546 B2 | 2/2009 | Yahagi et al. |
| 7,803,209 B2 | 9/2010 | Takahashi |
| 2005/0031484 A1 | 2/2005 | Nonaka et al. |
| 2007/0297938 A1 | 12/2007 | Takahashi |
| 2009/0071821 A1 | 3/2009 | Takahashi |

(Continued)

FOREIGN PATENT DOCUMENTS
EP    1394284 A1    3/2004
(Continued)

OTHER PUBLICATIONS
Machine Translation of JP 2004-162109 dated Jun. 10, 2004.*
(Continued)

*Primary Examiner* — Rodney G McDonald
(74) *Attorney, Agent, or Firm* — Howson & Howson LLP

(57) ABSTRACT

Provided is an Sb—Te alloy sintered compact target using atomized powder consisting of substantially spherical particles of an Sb—Te alloy, wherein the spherical atomized powder consists of particles that were crushed and flattened, and the flattened particles exhibiting a ratio (flatness ratio) of short axis and long axis of 0.6 or less occupy 50% or more of the overall particles. With this Sb—Te alloy sintered compact target, particles exhibiting a long axis orientation aligned within ±45° in a direction that is parallel to the target surface occupy 60% or more of the overall particles. In addition, the oxygen concentration in this Sb—Te alloy sintered compact target is 1500 wtppm or less. Thus, the Sb—Te alloy sputtering target structure can be uniformalized and refined, generation of cracks in the sintered target can be inhibited, and generation of arcing during sputtering can be inhibited. Further, surface ruggedness caused by sputter erosion can be reduced in order to obtain a high quality Sb—Te alloy sputtering target.

10 Claims, 2 Drawing Sheets

U.S. PATENT DOCUMENTS

2009/0301872 A1    12/2009    Yahagi et al.

FOREIGN PATENT DOCUMENTS

| JP | 03-162570 A | 7/1991 |
| JP | 2001-342505 A | 12/2001 |
| JP | 2001-342559 A | 12/2001 |
| JP | 2002-358699 | * 12/2002 |
| JP | 2004-162109 | * 6/2004 |
| JP | 2004-162109 A | 6/2004 |

OTHER PUBLICATIONS

Machine Translation of JP 2002-358699 dated Dec. 13, 2002.*
ESP@CENET Database, English Abstract of JP 2000-265262, Sep. 26, 2000.
ESP@CENET Database, English Abstract of JP 2001-098366, Apr. 10, 2001.
ESP@CENET Database, English Abstract of JP 2001-123266, May 8, 2001.
ESP@CENET Database, English Abstract of JP 10-081962, Mar. 31, 1998.
ESP@CENET Database, English Abstract of JP 2001-123267, May 8, 2001.
ESP@CENET Database, English Abstract of JP 2000-129316, May 9, 2000.
English Language Translation of International Preliminary Report on Patentability for International PCT Patent Application No. PCT/JP2005/021871.

* cited by examiner

200 μm a

100 μm b

250 μm a

50 μm b

SB-TE ALLOY SINTERED COMPACT TARGET AND MANUFACTURING METHOD THEREOF

BACKGROUND OF THE INVENTION

The present invention relates to an Sb—Te alloy sintered compact sputtering target and its manufacturing method having high density and transverse rupture strength, and capable of effectively inhibiting the generation of particles.

In recent years, a thin film formed from an Sb—Te material as the phase-change recording material is being used as a medium for recording information using so-called phase transformation. As a method of forming a thin film formed from an Sb—Te alloy material, a generally employed means known as a physical deposition method such as a vacuum deposition method or a sputtering method is used. In particular, a magnetron sputtering method is often used for forming such a thin film from the perspective of operability and coating stability.

Formation of a film according to the sputtering method is conducted by physically colliding positive ions such as Ar ions to a target disposed on a negative electrode, discharging the material configuring the target with such collision energy, and laminating a film having approximately the same composition as the target material on a substrate of the opposite positive electrode side.

Coating according to the sputtering method is characterized in that it is able to form from thin films of angstrom units to thick films of several ten μm with a stable deposition speed by adjusting the treating time and power supply.

A particular problem when forming a film formed with an Sb—Te alloy material for a phase-change recording film is the generation of particles during sputtering, generation of nodules (protrusions) that causes abnormal electrical discharge (micro arcing) or cluster-shaped thin films (films that get adhered as a cluster), generation of cracks or fractures of targets during sputtering, and absorption of large quantities of oxygen during the manufacturing process of sintering powder for targets.

Generation of cracks or fractures in a target occurs because the density and strength (transverse rupture strength) of the target is low. The foregoing problems concerning the target or sputtering process are significant causes in deteriorating the quality of the thin film as the recording medium.

It is known that the foregoing problems are significantly influenced by the grain size of the sintering powder or the structure and quality of the target. Nevertheless, conventionally, because the target obtained by sintering did not posses sufficient characteristics upon manufacturing an Sb—Te alloy sputtering target for forming a phase-change recording layer, it was not possible to avoid the generation of particles, abnormal electrical discharge, generation of nodules, and generation of cracks or fractures of the target during sputtering, or the inclusion of a large quantity of oxygen in the target.

As a conventional manufacturing method of an Sb—Te sputtering target, disclosed is a manufacturing method of a Ge—Sb—Te sputtering target including the steps of preparing powder by performing inert gas atomization for quenching to a Ge—Te alloy and an Sb—Te alloy, uniformly mixing the alloys having a ratio of Ge/Te=1/1 and Sb/Te=0.5 to 2.0, and thereafter performing pressure sintering thereto (for instance, refer to Patent Document 1).

Further, disclosed is a manufacturing method of a Ge—Sb—Te sputtering target and technology for manufacturing powder to be used therein employing the atomization method, including the steps of casting powder among the alloy powder containing Ge, Sb, Te in which the tap density (relative density) is 50% or greater into a mold, performing cold or hot pressurization thereto, and sintering the molding material in which the density after cold pressurization is 95% or greater through heat treatment in an Ar or vacuum atmosphere so as to make the oxygen content in the sintered compact 700 ppm or less (for instance, refer to Patent Document 2).

Further, disclosed is a manufacturing method of a Ge—Sb—Te sputtering target material including the steps of preparing rapidly-cooled powder by the inert gas atomization method from a raw material containing Ge, Sb, Te, and sintering a compact subject to cold or hot pressure forming using powder among said powder that is 20 μm or greater and having a particle size distribution where the specific surface area per unit weight is 300 mm$^2$/g or less (for instance, refer to Patent Document 3).

Other technologies for manufacturing targets using atomized powder are described in Patent Documents 4, 5, 6 indicated below.

Nevertheless, since the foregoing Patent Documents use the atomized powder as is, they are not able to obtain sufficient target strength, and it can hardly be said that they have achieved the refinement and homogenization of the target structure. Further, the tolerated oxygen content is high, and there is a problem in that the foregoing technologies are insufficient as an Sb—Te sputtering target for forming a phase-change recording layer.

[Patent Document 1] Japanese Patent Laid-Open Publication No. 2000-265262
[Patent Document 2] Japanese Patent Laid-Open Publication No. 2001-98366
[Patent Document 3] Japanese Patent Laid-Open Publication No. 2001-123266
[Patent Document 4] Japanese Patent Laid-Open Publication No. S10-81962
[Patent Document 5] Japanese Patent Laid-Open Publication No. 2001-123267
[Patent Document 6] Japanese Patent Laid-Open Publication No. 2000-129316

SUMMARY OF THE INVENTION

The present invention was devised in order to overcome the foregoing problems. Thus, an object of the present invention is to provide an Sb—Te alloy powder for sintering targets capable of effectively inhibiting the generation of particles, abnormal electrical discharge, general of nodules, and generation of cracks or fractures of the target during sputtering, and reducing gas components such as oxygen contained in the target. In particular, the present invention provides an Sb—Te alloy sintered compact sputtering target for forming a phase-change recording layer comprising an Ag—In—Sb—Te alloy or a Ge—Sb—Te alloy, and its manufacturing method.

The present inventors discovered that a technical means for overcoming the foregoing problems is in the devisal of powder quality and target structure and characteristics in order to obtain a stable and homogenous phase-change recording layer.

Based on the foregoing discovery, the present invention provides:
1. An Sb—Te alloy sintered compact target using atomized powder consisting of substantially spherical particles of an Sb—Te alloy, wherein the spherical atomized powder consists of particles that were crushed and flattened, and the flattened particles in which a ratio (flatness ratio) of short axis and long axis is 0.6 or less occupy 50% or more of the overall particles;

2. The Sb—Te alloy sintered compact target according to paragraph 1 above, wherein particles exhibiting a long axis orientation aligned within ±45° in a direction that is parallel to the target surface occupy 60% or more of the overall particles;

3. The Sb—Te alloy sintered compact target according to paragraph 1 or paragraph 2 above, wherein the oxygen concentration in the target is 1500 wtppm or less;

4. The Sb—Te alloy sintered compact target according to paragraph 1 or paragraph 2 above, wherein the oxygen concentration in the target is 1000 wtppm or less;

5. The Sb—Te alloy sintered compact target according to paragraph 1 or paragraph 2 above, wherein the oxygen concentration in the target is 500 wtppm or less;

6. A manufacturing method of an Sb—Te alloy sintered compact target for sputtering including the steps of press molding and sintering atomized powder consisting of substantially spherical particles of an Sb—Te alloy, wherein the spherical atomized powder is crushed and flattened, and the flattened particles existing in the sintered compact target in which a ratio (flatness ratio) of short axis and long axis is 0.6 or less occupy 50% or more of the overall particles; and 7. The manufacturing method of an Sb—Te alloy sintered compact target according to paragraph 6 above, wherein particles exhibiting a long axis orientation aligned within ±45° in a direction that is parallel to the target surface occupy 60% or more of the overall particles.

Incidentally, so as long as there is no known art regarding the conditions of paragraphs 1 to 7 above, it should be understood that each independent condition of paragraphs 1 and 6 above alone sufficiently satisfies the conditions as an invention. The dependent conditions; that is, paragraphs 2, 3, 4, 5 and 7 above are respectively conditions that are preferably incidental to the foregoing independent conditions. These dependent conditions also constitute a new invention by being combined with the conditions of paragraphs 1 or 6 above.

The Sb—Te alloy sintered compact is subject to cutting work and machining at the stage of finishing the target. With normal machining, however, strain such as numerous cracks is generated in the work-affected layer of the surface, and this strain causes the generation of particles. Since the present invention possesses high density and high transverse rupture strength, it is possible to considerably reduce the generation of nodules and particles that cause the foregoing cracks or fractures immediately after an operator starts using the target. Further, by reducing the oxygen content and improving the purity, it is possible to prevent abnormal electrical discharge (arcing) cased by impurities (oxides), and a significant effect is yielded in that it is possible to inhibit the generation of particles caused by arcing.

DETAILED DESCRIPTION OF THE INVENTION

Figure 1:
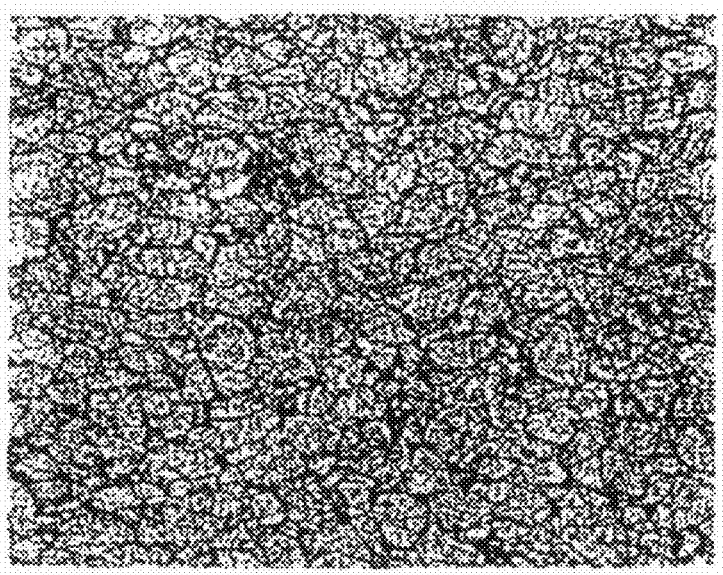
FIG. 1 is a micrograph showing the target surface of Example 1 (FIG. 1a shows a case where the display scale is 200 μm, and FIG. 1b shows a case where the display scale is 100 μm)
Figure 1:
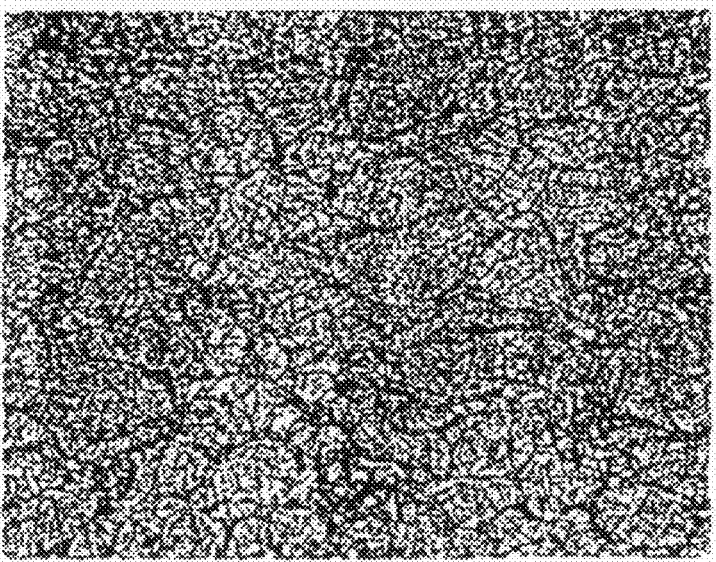

The present invention obtains a sputtering target by press molding and sintering substantially spherical gas atomized powder of an Sb—Te alloy.

Normally, as an Sb—Te alloy target, an Sn—Te alloy containing 10 to 90 at % of Sb, in particular 20 to 80 at % of Sb is used. Nevertheless, it goes without saying that the present invention is not limited to the foregoing component range, and may be applied outside such component range.

Generally speaking, with gas atomized powder, it is possible to obtain powder that is much finer than mechanical powder. In addition, since it is possible to prevent contamination caused by the use of a pulverizer, it could be said that it would be desirable to directly use gas atomized powder as sintering powder. A target sintered with the foregoing gas atomized powder can be easily processed to make the surface roughness Ra small at 0.1 μm or less. As described later, this is superior in terms of characteristics in comparison to machine-pulverized powder.

One of the major characteristics of the sputtering target of the present invention is that it uses atomized powder consisting of substantially spherical particles of an Sb—Te alloy, and, as a result of pressing and sintering this atomized powder, particles consisting of crushed and flattened spherical atomized powder are formed in the sintered compact target structure, and the flattened particles exhibiting a ratio (flatness ratio) of short axis to long axis of 0.6 or less occupy 50% or more of the overall particles.

This kind of target structure is able to increase the density, and significantly improve the transverse rupture strength. Therefore, the high-density, high-strength Sb—Te alloy sintered compact target of the present invention is able to considerably reduce the generation of cracks or fractures during the manufacture process. The Sb—Te alloy sintered compact target of the present invention is also able to effectively inhibit the generation of nodules and particles caused by the generation of cracks or fractures in the target.

In particular, it is desirable that the flattened particles exhibiting a long axis orientation aligned within ±45° in a direction that is parallel to the target surface occupy 60% or more of the overall particles. It is thereby possible to stably realize the improvement in the target density and improvement in the transverse rupture strength. Nevertheless, the flattened particles exhibiting a long axis orientation aligned within ±45° in a direction that is parallel to the target surface is merely incidental, and, needless to say, the flattened particles exhibiting a ratio (flatness ratio) of short axis to long axis of 0.6 or less occupying 50% or more of the overall particles is the primary factor in effectively inhibiting the generation of nodules and particles caused by the generation of cracks or fractures in the target.

Moreover, by reducing the oxygen and improving the purity of the Sb—Te alloy sintered compact sputtering target, it is possible to effectively prevent abnormal electrical discharge (arcing) caused by oxides, whereby the generation of nodules and particles caused by such arcing can also be inhibited.

Although it is desirable to reduce the oxygen content as impurities as much as possible, it is particularly desirable to make the content 1500 wtppm or less. The inclusion of oxygen in excess of the foregoing content will increase the amount of oxides and cause the generation of impurities. To reduce the oxygen content and to reduce the amount of oxides will lead to preventing arcing, and inhibiting the generation of nodules and particles caused by such arcing.

The Sb—Te alloy sintered compact sputtering target of the present invention may include, as additive elements, one or more elements selected from Ag, In, Ga, Ti, Au, Pt and Pd at a maximum of 25 at %. If the addition is within this range, it is possible to obtain the desired glass transition point and transformation speed, and simultaneously suppress to a minimum the surface defects caused by machining; whereby the generation of particles can be effectively inhibited.

Generally speaking, the eroded surface after sputtering becomes a rough surface where the surface roughness Ra is 1 µm or greater, and tends to become coarser together with the progress of sputtering. Nevertheless, the high-density Sb—Te alloy sputtering target according to the present invention is extremely unique in that the eroded surface after sputtering can be maintained at a surface roughness Ra of 0.4 µm or less, and is capable of effectively inhibiting the generation of nodules and particles.

Like this, the Sb—Te alloy target of the present invention having a uniform and unique structure is able to inhibit the generation of particles caused by the generation of cracks or fractures.

Further, refinement of the structure yields advantages in that it is possible to inhibit the in-plane and lot-to-lot compositional variability of the sputtered film, and the quality of the phase-change recording layer will become stable. Then, it will be possible to reduce the generation of particles and abnormal electrical discharge during sputtering, and consequently inhibit the generation of nodules.

Further, with the Sb—Te sputtering target of the present invention, it is possible to make the oxygen content 1500 ppm or less, preferably 1000 ppm or less, and more preferably 500 ppm or less. The reduction of gas components such as oxygen enables the further reduction in the generation of particles and nodules, and the generation of abnormal electrical discharge.

EXAMPLES

Examples of the present invention are now explained. Incidentally, these examples are merely illustrative, and the present invention shall in no way be limited thereby. In other words, the present invention shall include the various modes and modifications covered by the technical spirit of this invention. In addition, the following examples are described as preferable examples containing all conditions claimed herein so that the present invention can be easily understood and practiced. Nevertheless, the present invention does not require the inclusion of all of these conditions. In other words, it should be understood that an invention can be concluded even with only a part of the examples so as long as there is no known art.

Example 1

$Ge_2Sb_2Te_5$ alloy raw material was injected with a gas atomizer having a nozzle diameter 2.00 mm φ, argon gas (100 kgf/cm$^2$) as the injected gas, and temperature of 780° C. in order to manufacture atomized powder. Fine spherical powder was obtained thereby. The oxygen content of this gas atomized powder was 250 ppm.

This atomized powder was further pressed and sintered. The press pressure was 150 kgf/cm$^2$, and the press temperature was 600° C. The obtained sintered compact was subject to machining and polishing in order to obtain a $Ge_2Sb_2Te_5$ alloy target.

As a result, the percentage of particles in which the flatness ratio (ratio of short axis and long axis) in the target structure is 0.6 or greater was 80%. Further, the oxygen concentration of this target was 350 ppm, and the flatness orientation ratio of the structure (particles exhibiting a long axis orientation aligned within ±45° in a direction that is parallel to the target surface) was 90%. Moreover, the relative density was 100% and the transverse rupture strength was 70 MPa. No generation of fractures or cracks could be acknowledged. The results are shown in Table 1. The micrograph of the obtained target surface is shown in FIG. 1(a, b). FIG. 1a shows a case where the display scale is 200 µm, and FIG. 1b shows a case where the display scale is 100 µm. The press direction in both diagrams is in the vertical direction of the diagram (photo).

Sputtering was performed using this target. The result was no generation of arcing, and the number of generated particles and the number of generated nodules up to 100 kW·hr are similarly shown in Table 1.

As shown in Table 1, the number of generated particles when sputtering was performed up to 100 kW·hr was 30 particles/wafer, and the number of nodules in the target was 50 nodules/target, and a superior target was obtained.

|  | Unit | Example 1 | Example 2 | Comparative Example 1 | Comparative Example 2 | Comparative Example 3 | Comparative Example 4 |
| --- | --- | --- | --- | --- | --- | --- | --- |
| Material |  | GST | AIST | GST | GST | GST | AIST |
| Press Pressure | kgf/cm2 | 150 | 200 | 75 | 150 | 150 | 200 |
| Press Temperature |  | 600 | 500 | 600 | 500 | 600 | 400 |
| Flatness Ratio (≧0.6) | % | 80 | 85 | 30 | 20 | 30 | 20 |
| Shape of Raw Material Powder |  | G.A. | G.A. | G.A. | G.A. | Mechanical Pulverization | G.A. |
| G.A. Oxygen Concentration | wtppm | 250 | 140 | 250 | 250 | N.A. | 120 |
| Target Oxygen Concentration | wtppm | 350 | 160 | 350 | 350 | 1800 | 160 |
| Flatness Orientation Ratio of Structure | % | 90 | 80 | 70 | 60 | 35 | 70 |
| Relative Density | % | 100 | 95 | 81 | 85 | 99 | 80 |
| Transverse Rupture Strength | Mpa | 70 | 72 | 52 | 55 | 60 | 48 |
| Ave. Particle Count up to 100 kWh | Particles/Wafer | 30 | 21 | 102 | 85 | 150 | 90 |
| No. of Nodules | Nodules/Target | 50 | 35 | ≧300 | 240 | ≧300 | ≧300 |

GST: Ge—Sb—Te Alloy
AIST: Ag—In—Sb—Te Alloy
G.A.: Gas Atomized Powder
N.A.: Not Applicable

Example 2

Ag$_5$In$_5$Sb$_{70}$Te$_{20}$ alloy raw material was injected with a gas atomizer having a nozzle diameter 2.00 mm φ, argon gas (100 kgf/cm$^2$) as the injected gas, and temperature of 780° C. in order to manufacture atomized powder. Fine spherical powder was obtained thereby. The oxygen content of this gas atomized powder was 140 ppm.

This atomized powder was further pressed and sintered. The press pressure was 200 kgf/cm$^2$, and the press temperature was 500° C. The obtained sintered compact was subject to machining and polishing in order to obtain an Ag—In—Sb—Te alloy target.

As a result, the percentage of particles in which the flatness ratio (ratio of short axis and long axis) in the target structure is 0.6 or greater was 85%. Further, the oxygen concentration of this target was 160 ppm, and the flatness orientation ratio of the structure (particles exhibiting a long axis orientation aligned within ±45° in a direction that is parallel to the target surface) was 80%. Moreover, the relative density was 95% and the transverse rupture strength was 72 MPa. No generation of fractures or cracks could be acknowledged. The results are shown in Table 1.

Sputtering was performed using this target. The result was no generation of arcing, and the number of generated particles and the number of generated nodules up to 100 kW·hr are similarly shown in Table 1.

As shown in Table 1, the number of generated particles when sputtering was performed up to 100 kW·hr was 21 particles/wafer, and the number of nodules in the target was 35 nodules/target, and a superior target was obtained.

Comparative Example 1

Ge$_2$Sb$_2$Te$_5$ alloy raw material was injected with a gas atomizer having a nozzle diameter 2.00 mm φ, argon gas (100 kgf/cm$^2$) as the injected gas, and temperature of 780° C. in order to manufacture atomized powder. Fine spherical powder was obtained thereby. The oxygen content of this gas atomized powder was 250 ppm.

This atomized powder was further pressed and sintered. The press pressure was 75 kgf/cm$^2$, and the press temperature was 600° C. The obtained sintered compact was subject to machining and polishing in order to obtain a Ge$_2$Sb$_2$Te$_5$ alloy target.

Figure 2:
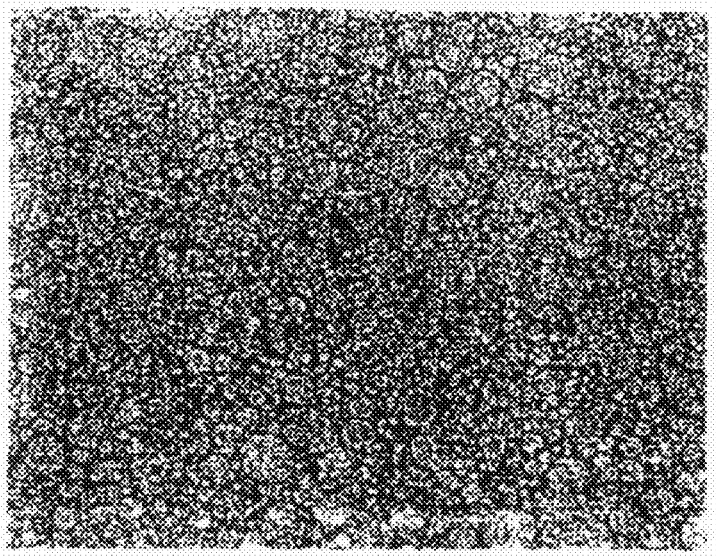
FIG. 2 is a micrograph showing the target surface of Comparative Example 1 (FIG. 2a shows a case where the display scale is 250 μm, and FIG. 2b shows a case where the display scale is 50 μm).
Figure 2:
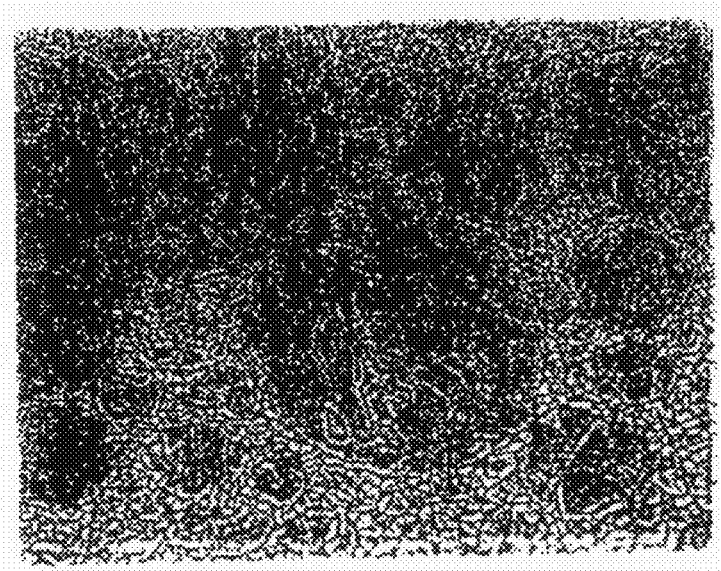

As a result, the percentage of particles in which the flatness ratio (ratio of short axis and long axis) in the target structure is 0.6 or greater was low at 30%. Further, the oxygen concentration of this target was 350 ppm, and the flatness orientation ratio of the structure (particles exhibiting a long axis orientation aligned within ±45° in a direction that is parallel to the target surface) was 70%. As a result, the relative density was low at 81% and the transverse rupture strength was significantly low at 52 MPa. Generation of cracks in the target could be acknowledged. The results are shown in Table 1. The micrograph of the obtained target surface is shown in FIG. 2(a, b). FIG. 2a shows a case where the display scale is 250 μm, and FIG. 2b shows a case where the display scale is 50 μm. The press direction in both diagrams is in the vertical direction of the diagram (photo) as with Example 1.

Sputtering was performed using this target. The result was generation of arcing, and the number of generated particles and the number of generated nodules up to 100 kW·hr are similarly shown in Table 1.

As shown in Table 1, the number of generated particles when sputtering was performed up to 100 kW·hr was abnormally large at 102 particles/wafer, and the number of nodules in the target was more than 300 nodules/target, and an inferior quality target was obtained.

Comparative Example 2

Ge$_2$Sb$_2$Te$_5$ alloy raw material was injected with a gas atomizer having a nozzle diameter 2.00 mm φ, argon gas (100 kgf/cm$^2$) as the injected gas, and temperature of 780° C. in order to manufacture atomized powder. Fine spherical powder was obtained thereby. The oxygen content of this gas atomized powder was 250 ppm.

This atomized powder was further pressed and sintered. The press pressure was 150 kgf/cm$^2$, and the press temperature was 500° C. The obtained sintered compact was subject to machining and polishing in order to obtain a Ge$_2$Sb$_2$Te$_5$ alloy target.

As a result, the percentage of particles in which the flatness ratio (ratio of short axis and long axis) in the target structure is 0.6 or greater was low at 20%. Further, the oxygen concentration of this target was 350 ppm, and the flatness orientation ratio of the structure (particles exhibiting a long axis orientation aligned within ±45° in a direction that is parallel to the target surface) was 60%. As a result, the relative density was low at 85% and the transverse rupture strength was significantly low at 55 MPa. Generation of cracks in the target could be acknowledged. The results are shown in Table 1.

Sputtering was performed using this target. The result was generation of arcing, and the number of generated particles and the number of generated nodules up to 100 kW·hr are similarly shown in Table 1.

As shown in Table 1, the number of generated particles when sputtering was performed up to 100 kW·hr was large at 85 particles/wafer, and the number of nodules in the target was more than 240 nodules/target, and an inferior quality target was obtained.

Comparative Example 3

The respective raw material powders of Ge, Sb, Te were subject to mechanical pulverization, the pulverized powder raw material was prepared and mixed to achieve an elemental ratio of Ge$_2$Sb$_2$Te$_5$, and then subject to pressing and sintering.

The press pressure was 150 kgf/cm$^2$, and the press temperature was 600° C. The obtained sintered compact was subject to machining and polishing in order to obtain a Ge$_2$Sb$_2$Te$_5$ alloy target.

As a result, the percentage of particles in which the flatness ratio (ratio of short axis and long axis) in the target structure is 0.6 or greater was low at 30%. Further, the oxygen concentration of this target increased to 1800 ppm, and the flatness orientation ratio of the structure (particles exhibiting a long axis orientation aligned within ±45° in a direction that is parallel to the target surface) was 35%. As a result, the relative density was high at 99%, but the transverse rupture strength was low at 60 MPa. Generation of cracks in the target could be acknowledged. The results are shown in Table 1.

Sputtering was performed using this target. The result was generation of arcing, and the number of generated particles and the number of generated nodules up to 100 kW·hr are similarly shown in Table 1.

As shown in Table 1, the number of generated particles when sputtering was performed up to 100 kW·hr was abnormally large at 150 particles/wafer, and the number of nodules in the target was more than 300 nodules/target, and an inferior quality target was obtained.

Comparative Example 4

Ag$_5$In$_5$Sb$_{70}$Te$_{20}$ alloy raw material was injected with a gas atomizer having a nozzle diameter 2.00 mm φ, argon gas (100 kgf/cm$^2$) as the injected gas, and temperature of 780° C. in order to manufacture atomized powder. Fine spherical powder was obtained thereby. The oxygen content of this gas atomized powder was 120 ppm.

This atomized powder was further pressed and sintered. The press pressure was 200 kgf/cm$^2$, and the press temperature was 400° C. The obtained sintered compact was subject to machining and polishing in order to obtain an Ag—In—Sb—Te alloy target.

As a result, the percentage of particles in which the flatness ratio (ratio of short axis and long axis) in the target structure is 0.6 or greater was low at 20%. Further, the oxygen concentration of this target was 160 ppm, and the flatness orientation ratio of the structure (particles exhibiting a long axis orientation aligned within ±45° in a direction that is parallel to the target surface) was 70%. As a result, the relative density was low at 80% and the transverse rupture strength was significantly low at 48 MPa. Generation of cracks in the target could be acknowledged. The results are shown in Table 1.

Sputtering was performed using this target. The result was generation of arcing, and the number of generated particles and the number of generated nodules up to 100 kW·hr are similarly shown in Table 1.

As shown in Table 1, the number of generated particles when sputtering was performed up to 100 kW·hr was abnormally large at 90 particles/wafer, and the number of nodules in the target was more than 300 nodules/target, and an inferior quality target was obtained.

Comparative Example 5

Ag$_5$In$_5$Sb$_{70}$Te$_{20}$ alloy raw material was injected with a gas atomizer having a nozzle diameter 2.00 mm φ, argon gas (100 kgf/cm$^2$) as the injected gas, and temperature of 780° C. in order to manufacture atomized powder. Fine spherical powder was obtained thereby. The oxygen content of this gas atomized powder was 180 ppm.

This atomized powder was further pressed and sintered. The press pressure was 200 kgf/cm$^2$, and the press temperature was 500° C. The obtained sintered compact was subject to machining and polishing in order to obtain an Ag—In—Sb—Te alloy target.

As a result, the percentage of particles in which the flatness ratio (ratio of short axis and long axis) in the target structure is 0.6 or greater was 60%. Further, the oxygen concentration of this target was 210 ppm, and the flatness orientation ratio of the structure (particles exhibiting a long axis orientation aligned within ±45° C. in a direction that is parallel to the target surface) was 55%. This flatness orientation ratio did not satisfy the condition of the present invention of being 60% or greater. As a result, the relative density was low at 83% and the transverse rupture strength was significantly low at 57 MPa. Generation of cracks in the target could be acknowledged. The results are shown in Table 1.

Sputtering was performed using this target. The result was generation of arcing, and the number of generated particles and the number of generated nodules up to 100 kW·hr are similarly shown in Table 1.

As shown in Table 1, the number of generated particles when sputtering was performed up to 100 kW·hr was large at 62 particles/wafer, and the number of nodules in the target was 120 nodules/target, and an inferior quality target was obtained.

The Sb—Te alloy sintered compact of the present invention is subject to cutting work and machining at the stage of finishing the target. With normal machining, however, strain such as numerous cracks is generated in the work-affected layer of the surface, and this strain causes the generation of particles. Since the present invention possesses high density and high transverse rupture strength, it is possible to considerably reduce the generation of nodules and particles that cause the foregoing cracks or fractures immediately after the use of the target. Further, by reducing the oxygen content and improving the purity, it is possible to prevent abnormal electrical discharge (arcing) cased by impurities (oxides), and a significant effect is yielded in that it is possible to inhibit the generation of particles caused by arcing. Thus, the present invention is extremely useful as a phase-change recording material; that is, a medium for recording information using so-called phase transformation.

The invention claimed is:

1. An Sb—Te alloy sintered compact target, comprising a sintered compact target made of atomized powder consisting of substantially spherical particles of an Sb—Te alloy, wherein said spherical atomized powder consists of particles that were crushed and flattened, and said flattened particles in which a ratio (flatness ratio) of short axis and long axis is 0.6 or less occupy 50% or more of the overall particles.

2. The Sb—Te alloy sintered compact target according to claim 1, wherein particles exhibiting a long axis orientation aligned within ±45° in a direction that is parallel to the target surface occupy 60% or more of the overall particles.

3. The Sb—Te alloy sintered compact target according to claim 2, wherein the oxygen concentration in the target is 1500 wtppm or less.

4. The Sb—Te alloy sintered compact target according to claim 2, wherein the oxygen concentration in the target is 1000 wtppm or less.

5. The Sb—Te alloy sintered compact target according to claim 2, wherein the oxygen concentration in the target is 500 wtppm or less.

6. A manufacturing method of an Sb—Te alloy sintered compact target for sputtering including the steps of press molding and sintering atomized powder consisting of substantially spherical particles of an Sb—Te alloy, wherein said spherical atomized powder is crushed and flattened, and said flattened particles existing in said sintered compact target in which a ratio (flatness ratio) of short axis and long axis is 0.6 or less occupy 50% or more of the overall particles.

7. The manufacturing method of an Sb—Te alloy sintered compact target according to claim 6, wherein particles exhibiting a long axis orientation aligned within ±45° in a direction that is parallel to the target surface occupy 60% or more of the overall particles.

8. An Sb—Te alloy sintered compact target according to claim 1, wherein the oxygen concentration in the target is 1500 wtppm or less.

9. An Sb—Te alloy sintered compact target according to claim 1, wherein the oxygen concentration in the target is 1000 wtppm or less.

10. An Sb—Te alloy sintered compact target according to claim 1, wherein the oxygen concentration in the target is 500 wtppm or less.

* * * * *

UNITED STATES PATENT AND TRADEMARK OFFICE
CERTIFICATE OF CORRECTION

| | | |
|---|---|---|
| PATENT NO. | : 7,943,021 B2 | Page 1 of 1 |
| APPLICATION NO. | : 11/722218 | |
| DATED | : May 17, 2011 | |
| INVENTOR(S) | : Hideyuki Takahashi | |

It is certified that error appears in the above-identified patent and that said Letters Patent is hereby corrected as shown below:

Column 9 line 52, "45° C." should read "45°".

Signed and Sealed this
Thirtieth Day of August, 2011

David J. Kappos
*Director of the United States Patent and Trademark Office*